United States Patent
Kim et al.

(10) Patent No.: US 12,451,467 B2
(45) Date of Patent: Oct. 21, 2025

(54) SEMICONDUCTOR DEVICE HAVING A REDISTRIBUTION BONDING INTERCONNECTION, A METHOD OF MANUFACTURING THE SEMICONDUCTOR DEVICE, AND A CHIP STACK PACKAGE INCLUDING THE SEMICONDUCTOR DEVICE

(71) Applicant: SK hynix Inc., Icheon-si (KR)

(72) Inventors: Si Yun Kim, Icheon-si (KR); Kang Hun Kim, Icheon-si (KR); Jun Yong Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 536 days.

(21) Appl. No.: 17/835,322

(22) Filed: Jun. 8, 2022

(65) Prior Publication Data
US 2023/0230960 A1    Jul. 20, 2023

(30) Foreign Application Priority Data
Jan. 20, 2022   (KR) .......................... 10-2022-0008773

(51) Int. Cl.
*H01L 25/00*   (2006.01)
*H01L 21/78*   (2006.01)
(Continued)

(52) U.S. Cl.
CPC .......... *H01L 25/0657* (2013.01); *H01L 21/78* (2013.01); *H01L 24/05* (2013.01);
(Continued)

(58) Field of Classification Search
CPC ...... H01L 25/0657; H01L 21/78; H01L 24/48
See application file for complete search history.

(56) References Cited

U.S. PATENT DOCUMENTS 8,963,312 B2 *   2/2015   Ho ...................... H01L 23/3121
                                                                257/784
2010/0006984 A1   1/2010   Watanabe et al.
(Continued)

FOREIGN PATENT DOCUMENTS

KR   1020100020766 A   2/2010
KR   1020100071522 A   6/2010
(Continued)

*Primary Examiner* — Trang Q Tran
(74) *Attorney, Agent, or Firm* — WILLIAM PARK AND ASSOCIATES LTD.

(57) ABSTRACT

A semiconductor device includes a chip body; a circuit layer over the chip body; an upper insulating layer over the circuit layer; a chip metal layer over the upper insulating layer, the chip metal layer including a pad portion; a passivation layer over the chip metal layer; a lower redistribution insulating layer over the passivation layer, the pad portion of the chip metal layer left exposed by the passivation layer and the lower redistribution insulating layer; a redistribution bonding interconnection over the lower redistribution insulating layer; and an upper redistribution insulating layer over the lower redistribution insulating layer. The redistribution bonding interconnection includes a pad connection portion electrically connected to the pad portion of the chip metal layer; a horizontal extension portion extending from the pad connection portion to a side surface of the chip body; a vertical extension portion disposed over the side surface of the chip body, the vertical extension portion extending downward from a side end portion of the horizontal extension portion; and a bonding portion disposed over the side surface of the chip body. The bonding portion is positioned at a lower end portion of the vertical extension portion.

11 Claims, 14 Drawing Sheets

(51) Int. Cl.
*H01L 23/00* (2006.01)
*H01L 25/065* (2023.01)

(52) U.S. Cl.
CPC .... *H01L 24/48* (2013.01); *H01L 2224/02311* (2013.01); *H01L 2224/02371* (2013.01); *H01L 2224/0239* (2013.01); *H01L 2224/04042* (2013.01); *H01L 2224/04105* (2013.01); *H01L 2224/48227* (2013.01)

(56) References Cited

U.S. PATENT DOCUMENTS

2015/0255312 A1* 9/2015 Brofman ........... H01L 23/49838
257/737
2019/0006354 A1* 1/2019 Wu ...................... H10D 84/038

FOREIGN PATENT DOCUMENTS

| KR | 1020110056768 A | 5/2011 |
| KR | 1020170022761 A | 3/2017 |
| KR | 1020200042818 A | 4/2020 |

\* cited by examiner

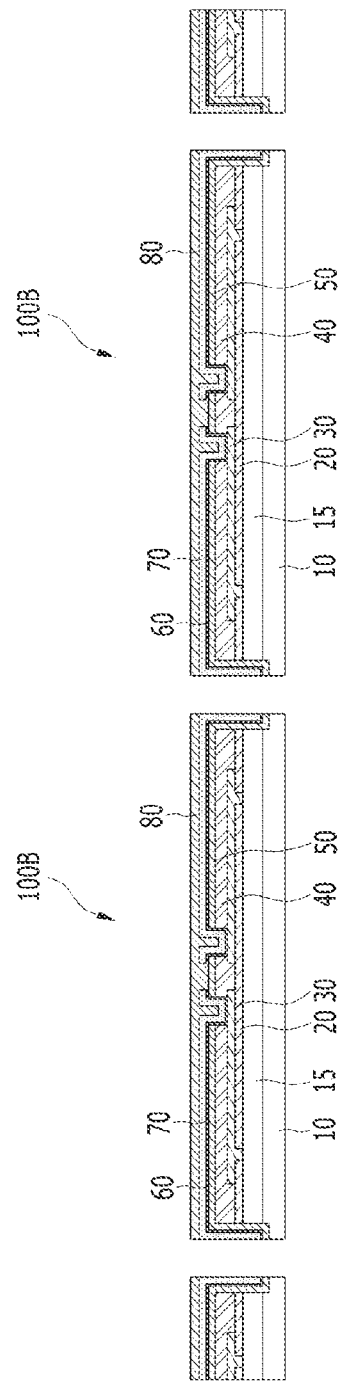

SEMICONDUCTOR DEVICE HAVING A REDISTRIBUTION BONDING INTERCONNECTION, A METHOD OF MANUFACTURING THE SEMICONDUCTOR DEVICE, AND A CHIP STACK PACKAGE INCLUDING THE SEMICONDUCTOR DEVICE

CROSS-REFERENCE TO RELATED APPLICATIONS

The present application claims priority to Korean Patent Application No. 10-2022-0008773, filed on Jan. 20, 2022, which is incorporated by reference herein in its entirety.

BACKGROUND

1. Field

The present disclosure relates to a semiconductor device having a redistribution bonding interconnection, a method of manufacturing the semiconductor device, and a chip stack package including the semiconductor device.

2. Description of the Related Art

The vertical height of a chip stack package is high and heat dissipation efficiency is low due to bonding pads disposed on upper surfaces of a semiconductor device.

SUMMARY

A semiconductor device according to an embodiment of the present disclosure includes a chip body, a circuit layer over the chip body, an upper insulating layer over the circuit layer, a chip metal layer over the upper insulating layer, the chip metal layer including a pad portion, a passivation layer over the chip metal layer, a lower redistribution insulating layer over the passivation layer, the pad portion of the chip metal layer left exposed by the passivation layer and the lower redistribution insulating layer, a redistribution bonding interconnection over the lower redistribution insulating layer, and an upper redistribution insulating layer over the redistribution layer. The redistribution bonding interconnection includes a pad connection portion electrically connected to the pad portion of the chip metal layer, a horizontal extension portion extending from the pad connection portion to a side surface of the chip body, a vertical extension portion disposed over the side surface of the chip body, the vertical extension portion extending downward from a side end portion of the horizontal extension portion, and a bonding portion disposed over the side surface of the chip body. The bonding portion is positioned at a lower end portion of the vertical extension portion.

A method of manufacturing a semiconductor device according to an embodiment of the present disclosure includes forming a circuit layer and a chip metal layer over a chip body including a chip region and a scribe lane region, wherein the chip metal layer has a pad portion, forming a passivation layer over the chip metal layer, the passivation layer having a hole exposing the pad portion, forming a groove in the scribe lane region of the chip body, forming a lower redistribution insulating layer over the passivation layer, the lower redistribution insulating layer leaving the pad portion of the chip metal layer exposed, wherein the lower redistribution insulating layer is conformally formed over an inner wall of the groove, forming a redistribution bonding interconnection over the lower redistribution insulating layer, the exposed pad portion, and the lower redistribution insulating layer over the inner wall of the groove, forming an upper redistribution insulating layer covering the upper redistribution bonding interconnection, and dividing the chip body along the scribe lane region, A chip stack package according to an embodiment of the present disclosure includes a base substrate, a plurality of semiconductor devices stacked over the base substrate, and bonding wires electrically connecting the base substrate to each of the semiconductor devices, Each of the semiconductor devices includes a chip metal layer over a chip body, the chip metal layer including a pad portion, a passivation layer having a hole exposing the pad portion of the chip metal layer, a lower redistribution insulating layer over the passivation layer, the lower redistribution insulating layer leaving the pad portion of the chip metal layer exposed through the hole, and a redistribution bonding interconnection over the lower redistribution insulating layer. The redistribution bonding interconnection includes a pad connection portion electrically connected to the pad portion of the chip metal layer, a horizontal extension portion extending from the pad connection portion to a side surface of the chip body, and a bonding portion disposed over the side surface of the chip body. The bonding wires electrically connect a plurality of substrate pads disposed over the base substrate to the bonding portion of the redistribution bonding interconnection of each of the plurality of the semiconductor devices.

BRIEF DESCRIPTION OF THE DRAWINGS

FIGS. 5A to 5C are views illustrating a method of manufacturing a semiconductor device according to an embodiment of the present disclosure.

DETAILED DESCRIPTION

Figure 1:
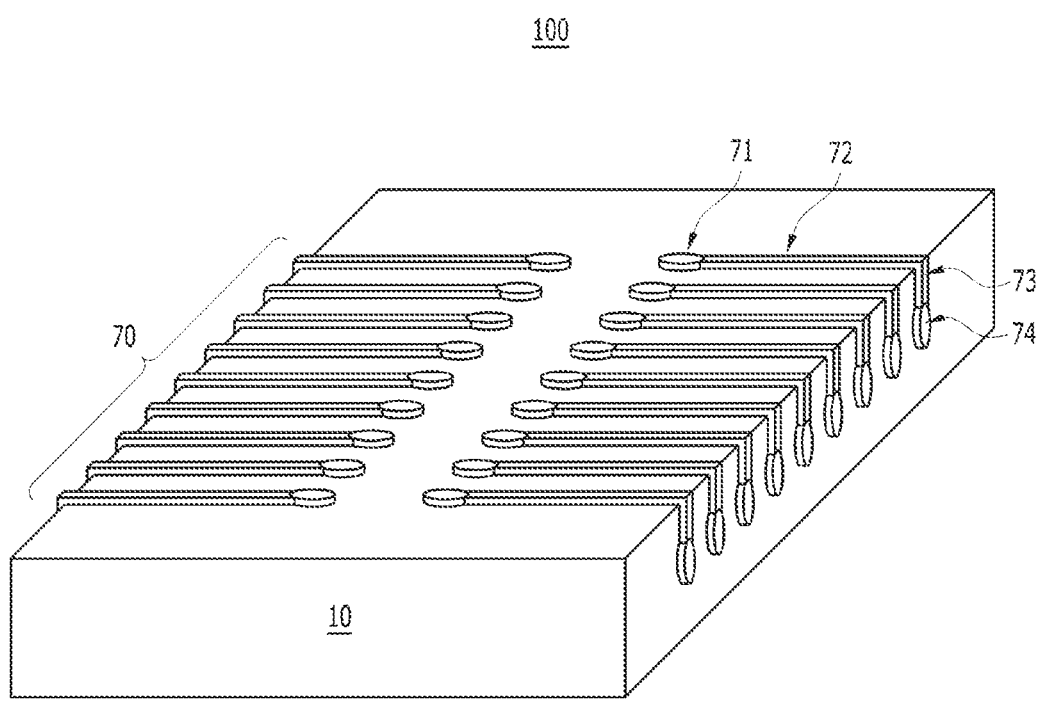
FIG. 1 is a perspective view of a semiconductor device 100 according to an embodiment of the present disclosure.

Embodiments of the present disclosure will be described below in more detail with reference to the accompanying drawings. The present disclosure may, however, be embodied in different forms and should not be construed as being limited to the embodiments set forth herein. Throughout the disclosure, like reference numerals refer to like parts throughout the various figures and embodiments of the present teachings.

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second dement could also be termed the first element.

Other expressions that explain the relationship between elements, such as "between", "directly between," "adjacent to," or "directly adjacent to" should be construed in the same way.

The drawings are not necessarily to scale, and in some instances, proportions may have been exaggerated in order to dearly illustrate features of the embodiments. When a first layer is referred to as being "on" a second layer, or "on" a substrate, it not only refers to a case where the first layer is formed directly on the second layer with no intervening layers but also to a case where intervening layers are formed between the first and second layers. It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present.

Embodiments of the present disclosure provide semiconductor devices having bonding pads disposed on side surfaces of the semiconductor devices.

Embodiments of the present disclosure provide methods of manufacturing semiconductor devices having bonding pads disposed on side surfaces of the semiconductor devices.

Embodiments of the present disclosure provide chip stack packages in which semiconductor devices having bonding pad disposed on side surfaces are stacked.

FIG. 1 is a perspective view of a semiconductor device 100 according to an embodiment of the present disclosure. Referring to FIG. 1, a semiconductor device 100 may include a plurality of redistribution bonding interconnections 70 disposed on a chip body 10. Each of the plurality of redistribution bonding interconnections 70 may include a pad connection portion 71, a horizontal extension portion 72, a vertical extension portion 73, and a bonding portion 74. The pad connection portion 71 may be a portion to provide an electrical connection connected to an electrical circuit inside the chip body 10. The horizontal extension portion 72 may extend from the pad connection portion 71 disposed at a central region of an upper surface of the chip body 10 to an edge region of the upper surface of the chip body 10. The vertical extension portion 73 may be disposed on a side surface of the chip body 10 and may downwardly extend from an end portion of the horizontal extension portion 72 toward a lower surface of the chip body. The bonding portion 74 may be disposed at a lower end portion of the vertical extension portion 73 on the side surface of the chip body 10 to provide a pad structure for wire bonding.

Figure 2A:
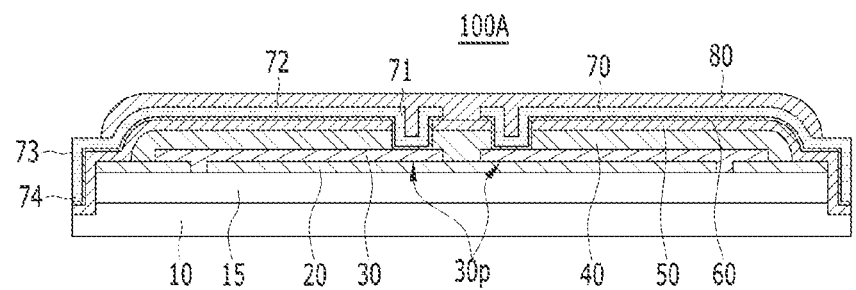
FIGS. 2A and 2B are side cross-sectional views of semiconductor devices 100A and 100B according to embodiments of the present disclosure.
Figure 2B:
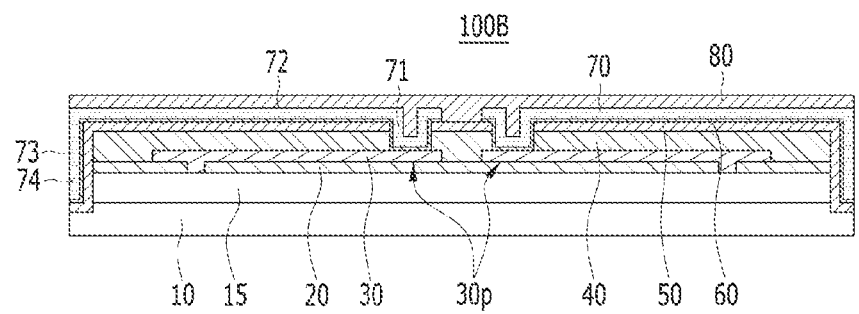

FIGS. 2A and 2B are side cross-sectional views of semiconductor devices 100A and 100B according to embodiments of the present disclosure. Referring to FIGS. 2A and 2B, each of semiconductor devices 100A and 100B may include a chip body 10, a circuit layer 15, an upper insulating layer 20, chip metal layers 30, a passivation layer 40, a lower redistribution insulating layer 50, seed layers 60, redistribution bonding interconnections 70, and an upper redistribution insulating layer 80. The circuit layer 15 may be disposed on the chip body 10. The upper insulating layer 20 may be disposed on the circuit layer 15. The chip metal layers 30 may be disposed on the upper insulating layer 20. The passivation layer 40 may be disposed on the upper insulating layer 20 and the chip metal layers 30. The lower redistribution insulating layer 50 may be disposed on the passivation layer 40. The seed layers 60 may be disposed on the lower redistribution insulating layer 50, The redistribution bonding interconnections 70 may be disposed on the seed layers 60. The upper redistribution insulating layer 80 may be disposed on the redistribution bonding interconnections 70.

The chip body 10 may include a semiconductor substrate such as a silicon wafer, The circuit layer 15 may include electrical circuits such as transistors, via contacts, and interconnections, and interlayer insulating layers. The upper insulating layer 20 may electrically insulate the circuit layer 15 and the chip metal layers 30. The upper insulating layer 20 may include an insulating material such as silicon dioxide ($SiO_2$). The chip metal layers 30 may correspond to the uppermost metal layer of the semiconductor circuit. The chip metal layers 30 may provide an electrical structure for communication or the exchange of signals between an external system and an electrical circuit in the chip body 10 or the circuit layer 15. For example, the chip metal layers 30 may include pad portions 30p. The passivation layer 40 may cover an upper surface of the upper insulating layer 20 and the chip metal layers 30. The passivation layer 40 may include a polyimide-based polymer. For example, the passivation layer 40 may include polyimide isoindro quindzoline (PIQ). In an embodiment, the passivation layer 40 may include an inorganic material such as silicon nitride ($Si_3N_4$) or silicon dioxide ($SiO_2$). The passivation layer 40 may expose the pad portions 30p of the chip metal layers 30. The lower redistribution insulating layer 50 may be conformally formed on the passivation layer 40, so that the contour of the lower redistribution insulating layer 50 follows the contour the passivation layer 40. The lower redistribution insulating layer 50 may also expose the pad portions 30p of the chip metal layers 30. The lower redistribution insulating layer 50 may include an inorganic insulating material such as silicon dioxide ($SiO_2$) or silicon nitride ($Si_3N_4$), or a polyimide-based polymer insulating material. The seed layers 60 may be conformally formed on the lower redistribution insulating layer 50 and the exposed pad portions 30p of the chip metal layers 30. The seed layers 60 may also be formed on side surfaces of the chip body 10 or the circuit layer 15. The seed layer 60 may include at least one of titanium (Ti), copper (Cu), and nickel (Ni). The seed layers 60 may be divided from each other in the central region of the upper surface of the chip body 10. The redistribution boding interconnections 70 may be in contact with the chip metal layers each other to be electrically connected to the chip metal layers 30, respectively. The redistribution bonding interconnections 70 may also be formed on the seed layers 60 disposed on the side surfaces of the chip body 10 or the circuit layer 15. Each of the redistribution bonding interconnections 70 may include a pad connection portion 71, a horizontal extension portion 72, a vertical extension portion 73, and a bonding portion 74. The pad connection portion 71 may be positioned on the exposed pad portions 30p of the chip metal layers 30. The horizontal extension portion 72 may extend from the pad connection portion 71 disposed in the central region of the chip region CR to the scribe lane region SR. The vertical extension 73 may be positioned on the side surface of the chip body 10 or the circuit layer 15 to downwardly extend from a side end portion of the horizontal extension 72. The bonding portion 74 may be positioned at a lower end portion of the vertical extension portion 73 to provide a pad structure for wire bonding. The upper redistribution insulating layer 80 may cover the pad connection portion 71 and the horizontal extension portion 72 of the redistribution bonding interconnection 70 disposed on the upper surface of the chip body 10. The upper redistribution insulating layer 80 might not cover the vertical extension portion 73 and the bonding portion 74 of the redistribution bonding interconnection 70 disposed on the side surface of the chip body 10. The upper redistribution insulating layer 80 may include an inorganic insulating material such as silicon dioxide ($SiO_2$) or silicon nitride ($Si_3N_4$), or a polyimide-based polymeric insulating material.

End portions of the seed layers 60 and the lower redistribution insulating layer 50 may be exposed under the bonding portion 74 of the redistribution bonding interconnection 70 on the side surface of the chip body 10 or the circuit layer 15.

The semiconductor devices 100A and 100B, according to embodiments of the present disclosure, may have the bonding portions 74 disposed on the side surfaces of the chip body 10 or the circuit layer 15 for wire bonding. Accordingly, the total thickness or height of the semiconductor devices 100A and 100E can be reduced.

Referring to FIG. 2A, the passivation layer 40 may expose portions of the upper insulating layer 20 in edge regions of the semiconductor device 100A. For example, in the edge regions of the semiconductor device 100A, the lower redistribution insulating layer 50, and the upper insulating layer 20 may be directly in contact with each other. In addition, in the edge regions of the semiconductor device 100A, the upper redistribution insulating layer 80 may expose portions of the redistribution bonding interconnection 70.

Referring to FIG. 2B, the passivation layer 40 may entirely or completely cover the upper insulating layer 20. In addition, the upper redistribution insulating layer 80 may entirely or completely is cover an upper surface of the redistribution bonding interconnection 70.

Figure 3A:
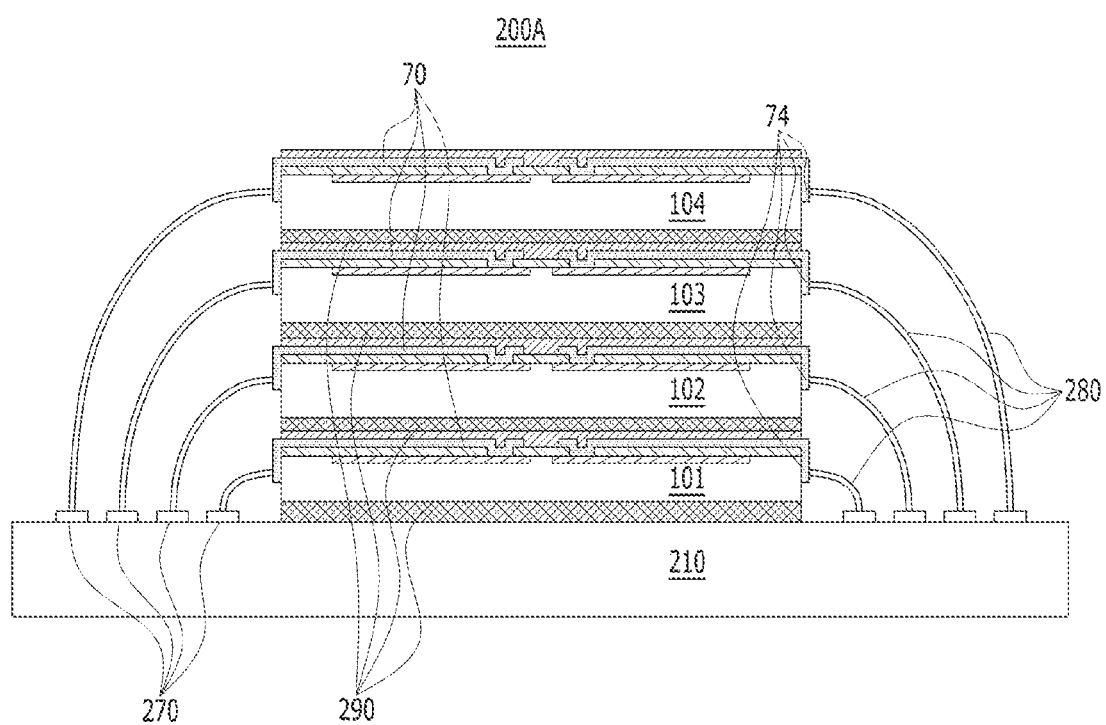
FIGS. 3A and 3B are side views illustrating chip stack packages 200A and 200B according to embodiments of the present disclosure.
Figure 3B:
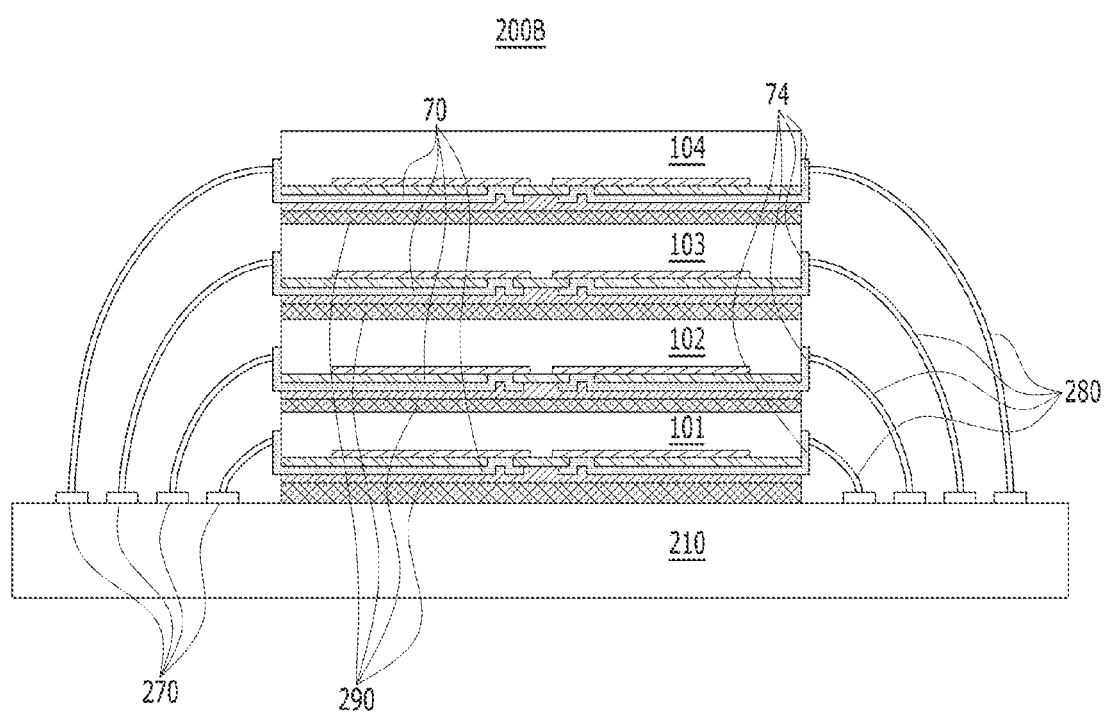

FIGS. 3A and 3B are side views illustrating chip stack packages 200A and 200B according to embodiments of the present disclosure. Referring to FIGS. 3A and 3B, each of chip stack packages 200A and 200B may include a plurality of semiconductor devices 101 to 104 stacked on a base substrate 210, and bonding wires 280 electrically connecting electrical interconnections in the base substrate 210 to the plurality of semiconductor devices 101 to 104. The semiconductor devices 101 to 104 may be one of the semiconductor devices 100A and 100B illustrated in FIGS. 2A and 2B, respectively.

A plurality of substrate pads 270 may be disposed on the base substrate 210, The plurality of substrate pads 270 may be electrically connected to the plurality of semiconductor devices 101 to 104 through bonding wires 280, respectively. The bonding wires 280 may be bonded to the substrate pads 270 on the base substrate 210 and the bonding portions 74 of the redistribution bonding interconnections 70 disposed on the side surfaces of the semiconductor devices 101 to 104, respectively. The semiconductor devices 101 to 104 may be adhered and stacked through the die adhesive layers 290. Because the bonding wires 280 may be bonded to the bonding portions 74 of the redistribution bonding interconnections 70 disposed on the side surfaces of the semiconductor devices 101 to 104, spaces between the semiconductor devices 101 to 104 can be reduced and minimized. Accordingly, the stack height of the semiconductor devices 101 to 104 can be reduced, the vertical thickness of the chip stack packages 200A and 200B can be thinned, and signal transmission efficiency and heat dissipation efficiency can be improved.

Referring to FIG. 3A, the chip stack package 200A according to the embodiment of the present disclosure may include semiconductor devices 101 to 104 stacked in a face-up (bottom-down) configuration.

Referring to FIG. 3B, the chip stack package 200B according to the embodiment of the present disclosure may include semiconductor devices 101 to 104 stacked in a face-down (bottom-up) configuration. That is, the redistribution bonding interconnections (70 of FIGS. 2A and 2B) of the semiconductor elements 101 to 104 are stacked to face downward and bottom surfaces of the chip bodies (10 of FIGS. 2A and 2B) face upward. Accordingly, the bottom surface of the chip body 10 of the topmost semiconductor device 104 may be exposed. Accordingly, heat generated in the chip bodies 10 of the semiconductor devices 101 to 104 in the chip stack package 200B can be more efficiently dissipated than the chip stack package 200A shown in FIG. 3A.

Figure 4A:
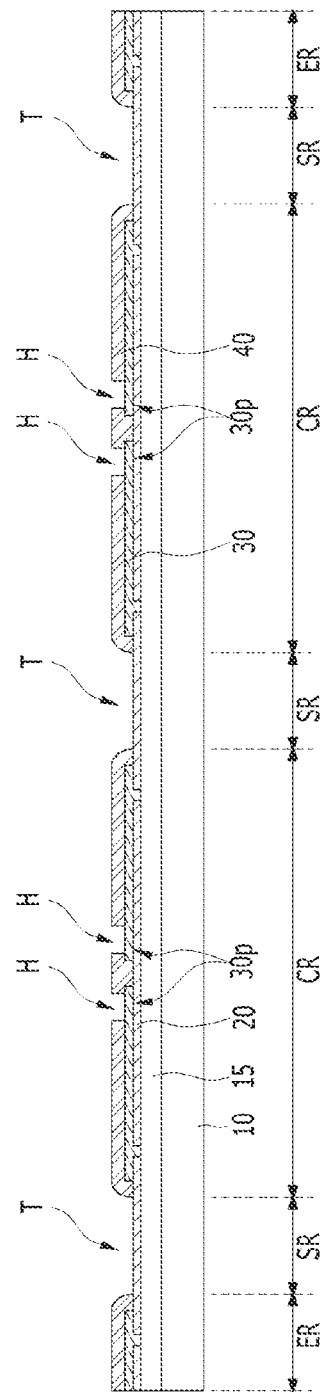
FIGS. 4A to 4G are views illustrating a method of manufacturing a semiconductor device according to an embodiment of the present disclosure.

FIGS. 4A to 4G are views illustrating a method of manufacturing a semiconductor device according to an embodiment of the present disclosure. Referring to FIG. 4A, the method may include forming a circuit layer 15, an upper insulating layer 20, a chip metal layer 30, and a passivation layer 40 on a chip body 10. The chip body 10 may have a chip region CR, a scribe lane region SR, and an edge region ER. The chip body 10 may be a silicon wafer. Forming the circuit layer 15 may include forming transistors, via contacts, interconnections, and a plurality of insulating layers on an active surface of the chip body 10. The upper insulating layer 20 may include silicon nitride ($Si_3N_4$) or silicon dioxide ($SiO_2$). Forming the chip metal layer 30 may include forming a metal interconnection connected to the circuit layer 15 of the chip body 10 by performing a deposition process and a patterning process. For example, the chip metal layer 30 may be an uppermost metal layer of a semiconductor circuit. The chip metal layer 30 may include a metal such as aluminum (Al) or tungsten (W). The chip metal layer 30 may include pad portions 30$p$ for electrically connecting to an external system. The pad portions 30$p$ may be exposed by holes H. Forming the passivation layer 40 may include forming an insulating layer covering the chip metal layer 30 by performing a coating process or a deposition process. The passivation layer 40 may include a polyimide-based polymer. For example, the passivation layer 40 may include polyimide isoindro quindzoline (PIQ). In an embodiment, the passivation layer 40 may include an inorganic material such as silicon nitride ($Si_3N_4$) or silicon dioxide ($SiO_2$). The passivation layer 40 may have the holes H and trenches T. As mentioned above, the holes H may expose portions, i.e., the pad portions 30$p$ of the chip metal layer 30. The trenches T may expose the upper insulating layer 20 in the scribe lane region SR.

Figure 4B:
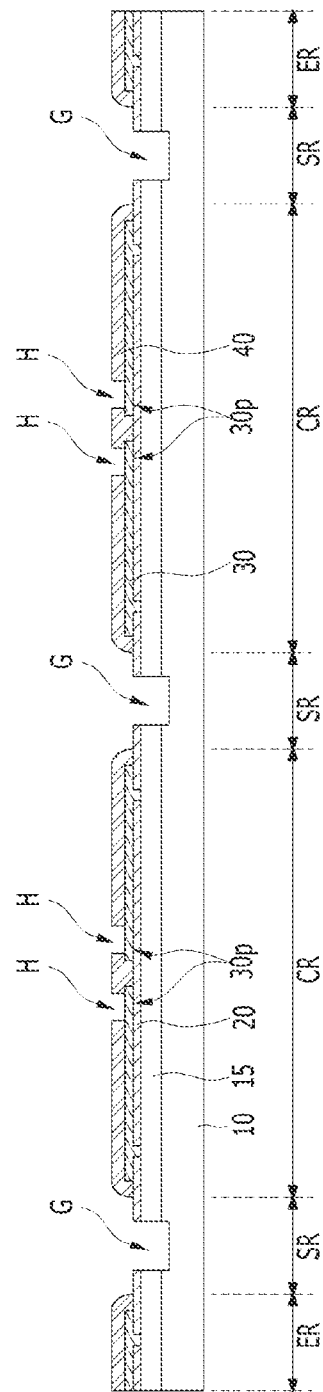

Referring to FIG. 4B, the method may further include forming grooves G in the trenches T in the scribe lane region SR by performing a grooving process using a laser. The grooves G may be formed by partially removing the upper insulating layer 20 and the circuit layer 15 in the scribe lane region SR. Th grooves G may expose a surface of the circuit layer 15 or the chip body 10.

Figure 4C:
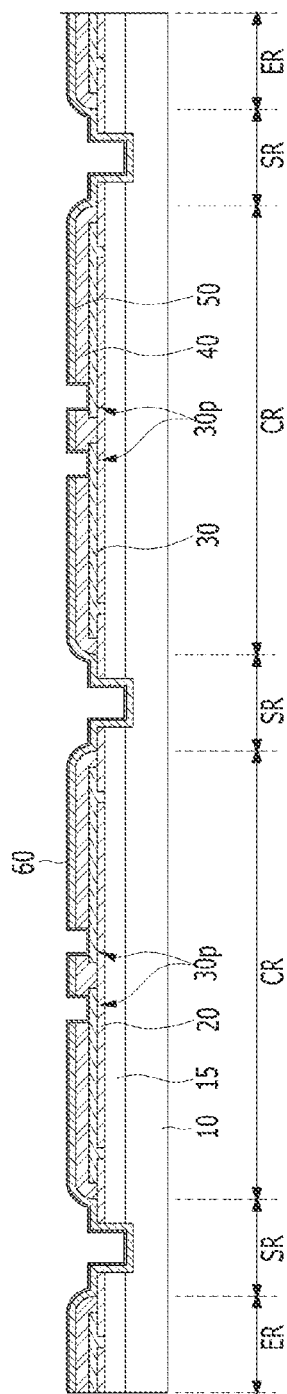

Referring to FIG. 4C, the method may further include entirely forming a lower redistribution insulating layer 50 and forming a seed layer 60 on the lower redistribution insulating layer 50. Forming the lower redistribution insulating layer 50 may include forming an inorganic insulating material layer by performing a deposition process, or forming a polymeric organic material layer by performing a coating process. The lower redistribution insulating layer 50 may include silicon nitride ($Si_3N_4$), silicon dioxide ($SiO_2$), or a polyimide-based polymer. The lower redistribution insulating layer 50 may still expose the pad portions 30$p$ of the chip metal layer 30 exposed in the holes H. The lower redistribution insulating layer 50 may also be conformally formed in the grooves G in that the contour of the lower redistribution insulating layer 50 may follow the contour of the grooves G. The seed layer 60 may be conformally formed on the lower redistribution insulating layer 50. The seed layer 60 may also be formed on the exposed pad portions 30p of the chip metal layer 30. The seed layer 60 may also be formed on the lower redistribution insulating layer 50 in the grooves G. Forming the seed layer 60 may include performing a deposition process such as a PVD (Physical Vapor Deposition) process. The seed layer 60 may include at least one of metals such as titanium (Ti), copper (Cu), or nickel (Ni).

Figure 4D:
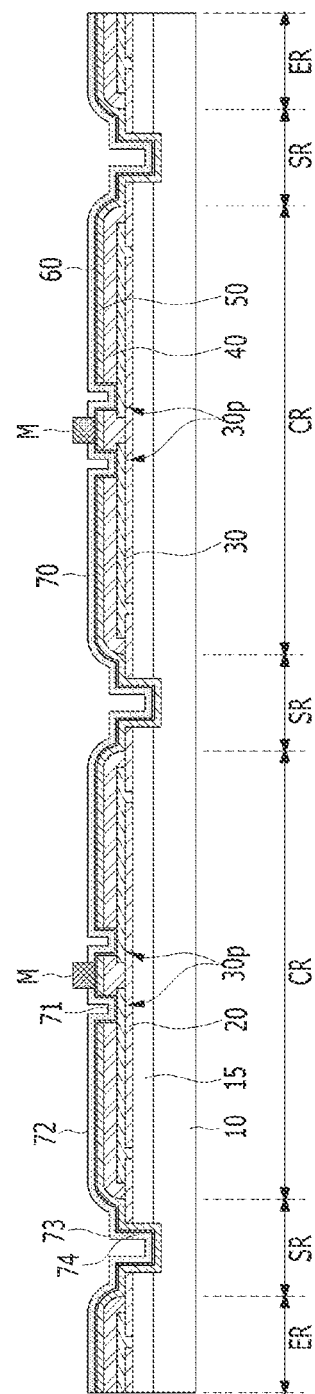

Referring to FIG. 4D, the method may further include forming a plating mask M on the seed layer 60, and forming a redistribution bonding interconnection 70 on the exposed seed layer 60 by performing a plating process. The plating mask M may cover some portions of the seed layer 60 and leave other portions of the seed layer 60 exposed. The plating mask M may include a polymeric organic material such as a photoresist. The redistribution bonding interconnection 70 may be conformally formed on the seed layer 60 by the plating process. The redistribution bonding interconnection 70 may include a pad connection portion 71 vertically overlapping with the pad portions 30p, a horizontal extension portion 72 extending from the pad connection portion 71 to the grooves G in the scribe lane region SR, a vertical extension portion 73 disposed in the grooves G and extending downwardly from a side end portion of the horizontal extension portion 72, and a bonding portion 74 disposed at a lower end portion of the vertical extension portion 73. The redistribution bonding interconnection 70 may include a metal such as copper (Cu), gold (Au), silver (Ag), or nickel (Ni). The redistribution bonding interconnection 70 may be conformally formed on the seed layer 60 on the pad portions 30p of the chip metal layer 30. That is, the holes H shown in FIG. 4B might not be completely filled. In an embodiment, the pad connection portion 71 of the redistribution bonding interconnection 70 may be formed in a pillar shape on the seed layer 60 on the pad portions 30p of the chip metal layer 30. That is, the holes H of FIG. 4B may be completely filled with the pad connection portion 71 by the plating process.

Figure 4E:
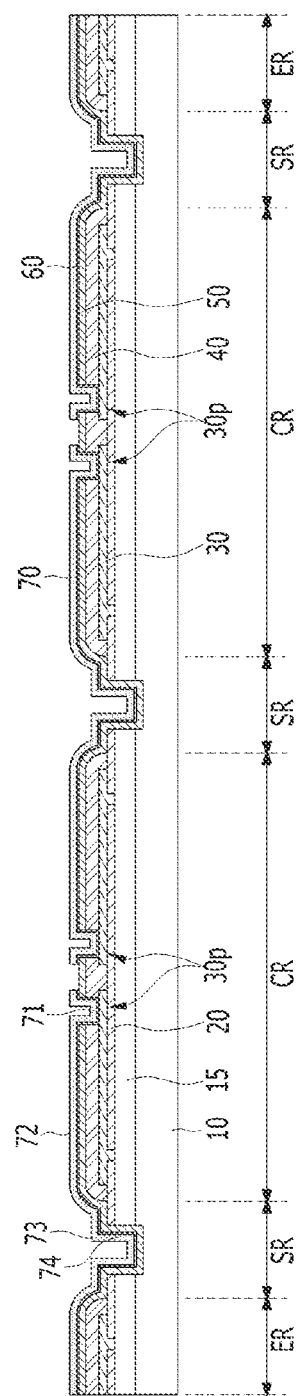

Referring to FIG. 4E, the method may further include removing the plating mask M and removing the seed layer 60 under the plating mask M exposed when the plating mask M is removed. Removing the plating mask M may include performing an ashing process using oxygen plasma or a wet strip process using sulfuric add. The lower redistribution insulating layer 50 may be exposed under the removed seed layer 60. After removing the plating mask M, the method may further include removing the seed layer 60 exposed under the removed plating mask M by performing a cleaning process or a weak wet etching process as a whole.

Figure 4F:
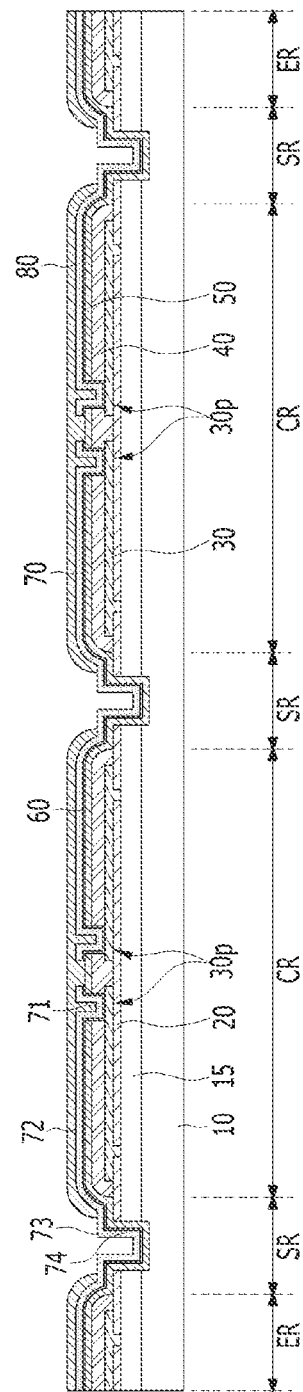

Referring to FIG. 4F, the method may further include entirely forming an upper redistribution insulating layer 80 by performing a deposition process or a coating process. The upper redistribution insulating layer 80 may cover an upper surface of the redistribution bonding interconnection 70. In an embodiment, the method may further include removing the upper redistribution insulating layer 80 in the scribe lane region SR. That is, the upper redistribution insulating layer 80 might not be formed in the scribe lane region SR. The upper redistribution insulating layer 80 may include an inorganic insulating material such as silicon nitride ($Si_3N_4$) or silicon dioxide ($SiO_2$), or a polyimide-based polymer insulating material.

Figure 4G:
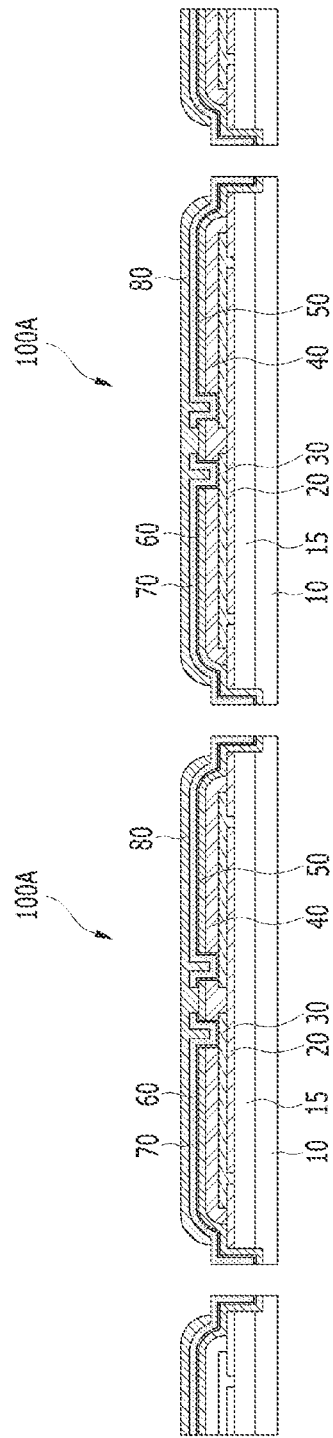

Referring to FIG. 4G, the method may further include partially removing a lower surface of the chip body 10 by performing a wafer thinning process, and manufacturing individual semiconductor devices 100A by performing a singulation process. The wafer thinning process may include a grinding process or an etching process. The singulation process may include cutting and dividing the chip body 10 along the scribe lane region SR. For example, the singulation process may include performing a mechanical sawing process or a laser drilling process. End portions of the seed layer 60 and the lower redistribution insulating layer 50 may be exposed under the bonding portion 74 of the redistribution bonding interconnection 70 on the side surface of the chip body 10.

Figure 5A:
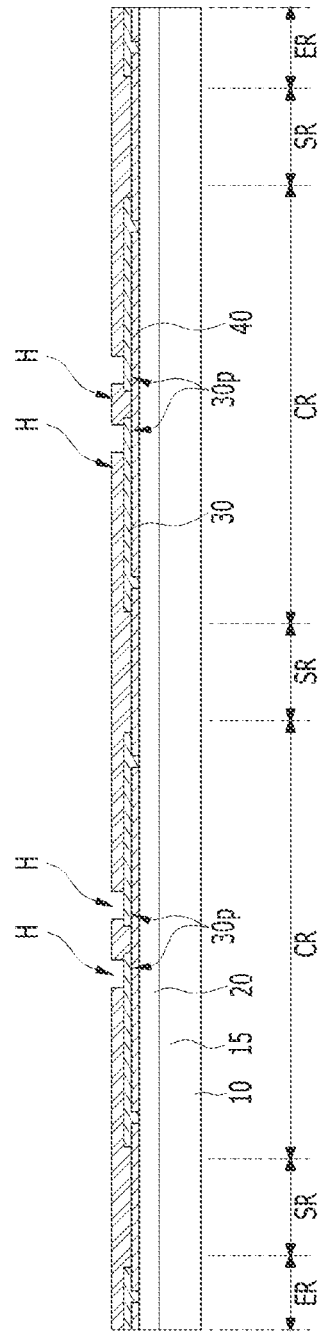
Figure 5B:
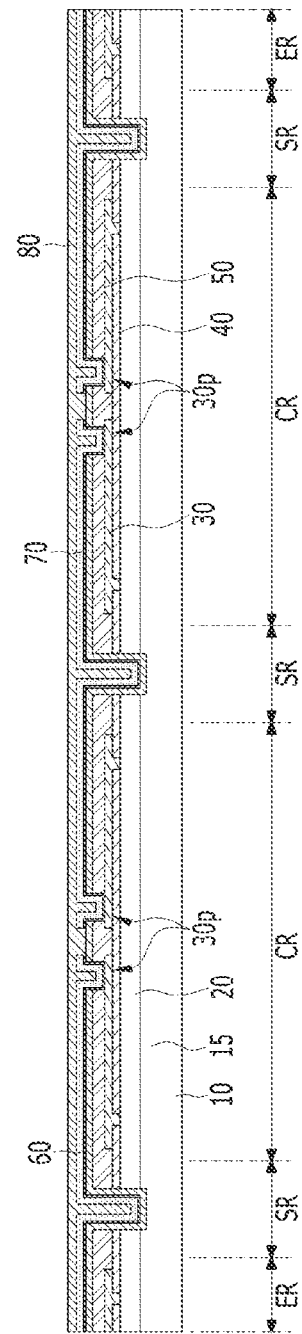

FIGS. 5A to 5C are views illustrating a method of manufacturing a semiconductor device according to an embodiment of the present disclosure. Referring to FIG. 5A, the method may include forming a passivation layer on a chip body 10. The chip body 10 may include a circuit layer 15, an upper insulating layer 20, and a chip metal layer 30. The passivation layer 40 may have holes H exposing pad portions 30p of the chip metal layer 30. Compared to FIG. 4A, the passivation layer 40 may cover the scribe lane region SR without the trenches T.

Referring to FIG. 53, the method may further include forming grooves G, forming a lower redistribution insulating layer 50, forming a seed layer 60, forming a plating mask M, forming a redistribution bonding interconnection 70, removing the plating mask M and portions of the seed layer 60 under the removed plating mask M, and forming an upper redistribution insulating layer 80 by performing the processes described with reference to FIGS. 4B to 4F. The upper redistribution insulating layer 80 may also be formed in the scribe lane region SR. For example, the upper redistribution insulating layer 80 may partially or completely fill the grooves G in the scribe lane region SR.

Referring to FIG. 5C, the method may further include partially removing a lower surface of the chip body 10 by performing the processes described with reference to FIG. 4G, and manufacturing individual semiconductor devices 100B by performing a singulation process.

According to embodiments of the present disclosure, heat dissipation efficiency of a semiconductor device and a chip stack package can be improved.

According to the embodiments of the present disclosure, a vertical height of a chip stack package can be reduced.

Although the present teachings have been specifically described according to the embodiments presented above, it should be noted that the above-described embodiments are for the purpose of explanation and not for the limitation thereof. In addition, it will be appreciated by person having ordinary skill in the art that various embodiments are possible within the scope of the present teachings.

What is claimed is:

1. A semiconductor device comprising:
    a chip body;
    a circuit layer over the chip body;
    an upper insulating layer over the circuit layer;
    a chip metal layer over the upper insulating layer, the chip metal layer including a pad portion;
    a passivation layer over the chip metal layer;
    a lower redistribution insulating layer over the passivation layer, the pad portion of the chip metal layer left exposed by the passivation layer and the lower redistribution insulating layer;
    a seed layer over the lower redistribution insulating layer;

a redistribution bonding interconnection over the seed layer; and an upper redistribution insulating layer over the redistribution bonding interconnection, wherein the redistribution bonding interconnection comprises:

a pad connection portion electrically connected to the pad portion of the chip metal layer;

a horizontal extension portion extending from the pad connection portion to a side surface of the chip body;

a vertical extension portion disposed over the side surface of the chip body, the vertical extension portion extending downward from a side end portion of the horizontal extension portion; and a bonding portion disposed over the side surface of the chip body, wherein the bonding portion is positioned at a lower end portion of the vertical extension portion, wherein end portions of the seed layer and the lower redistribution insulating layer are exposed under the bonding portion of the redistribution bonding interconnection on the side surface of the chip body.

2. The semiconductor device of claim 1, wherein the redistribution bonding interconnection includes at least one of gold (Au), silver (Ag), copper (Cu), and aluminum (Al).

3. The semiconductor device of claim 1, wherein the seed layer includes at least one of titanium (Ti), copper (Cu), and nickel (Ni).

4. The semiconductor device of claim 1, wherein the upper redistribution insulating layer covers the pad connection portion and the horizontal extension portion of the redistribution bonding interconnection.

5. The semiconductor device of claim 1, wherein:
the upper insulating layer includes silicon dioxide ($SiO_2$), and
the passivation layer includes a polyimide-based polymeric organic material.

6. The semiconductor device of claim 1, wherein:
the passivation layer partially exposes the upper insulating layer, and
an exposed portion of the upper insulating layer and the lower redistribution insulating layer are in contact with each other.

7. The semiconductor device of claim 1, wherein the circuit layer includes transistors, via contacts, conductive interconnections, and interlayer insulating layers disposed over the chip body.

8. A chip stack package comprising:
a base substrate;
a plurality of semiconductor devices stacked over the base substrate; and
bonding wires electrically connecting the base substrate to each of the plurality of semiconductor devices, wherein each of the plurality of semiconductor devices comprises:

a chip metal layer over a chip body, the chip metal layer including a pad portion;

a passivation layer having a hole exposing the pad portion of the chip metal layer;

a lower redistribution insulating layer over the passivation layer, the lower redistribution insulating layer leaving the pad portion of the chip metal layer exposed through the hole; and a redistribution bonding interconnection over the lower redistribution insulating layer, wherein the redistribution bonding interconnection includes:

a pad connection portion electrically connected to the pad portion of the chip metal layer;

a horizontal extension portion extending from the pad connection portion to a side surface of the chip body; and a bonding portion disposed on the side surface of the chip body, and wherein the bonding wires electrically connect a plurality of substrate pads disposed over the base substrate to the bonding portion of the redistribution bonding interconnection of each of the plurality of the semiconductor devices, wherein side surfaces of the plurality of semiconductor devices are vertically co-planar wherein the bonding portion of each of the plurality of semiconductor devices laterally protrudes from the side surface of each of the plurality of semiconductor devices, wherein end portions of the seed layer and the lower redistribution insulating layer are exposed under the bonding portion of the redistribution bonding interconnection on the side surface of the chip body.

9. The chip stack package of claim 8, wherein the plurality of semiconductor devices are stacked in a face-down configuration.

10. The chip stack package of claim 8, wherein each of the plurality of semiconductor devices further comprises a seed layer between the lower redistribution insulating layer and the redistribution bonding interconnection.

11. The chip stack package of claim 10, wherein end portions of the seed layer and the lower redistribution insulating layer are exposed under the bonding portion of the redistribution bonding interconnection on the side surface of the chip body.

* * * * *